(12) United States Patent
Lee et al.

(10) Patent No.: US 9,240,518 B2
(45) Date of Patent: Jan. 19, 2016

(54) LIGHT EMITTING DIODE DEVICE HAVING SUPER LATTICE STRUCTURE AND A NANO-STRUCTURE LAYER

(71) Applicant: National Chiao Tung University, Hsinchu (TW)

(72) Inventors: Chia-Yu Lee, Chiayi (TW); Da-Wei Lin, New Taipei (TW); An-Jye Tzou, New Taipei (TW); Hao-Chung Kuo, Hsinchu (TW)

(73) Assignee: National Chiao Tung University, Taiwan (CN)

( * ) Notice: Subject to any disclaimer, the term of this patent is extended or adjusted under 35 U.S.C. 154(b) by 0 days.

(21) Appl. No.: 14/461,990

(22) Filed: Aug. 18, 2014

(65) Prior Publication Data
US 2015/0287879 A1 Oct. 8, 2015

(30) Foreign Application Priority Data
Apr. 2, 2014 (TW) .............................. 103112244 A

(51) Int. Cl.
*H01L 33/12* (2010.01)
*H01L 33/32* (2010.01)
*H01L 33/06* (2010.01)
*H01L 33/00* (2010.01)

(52) U.S. Cl.
CPC ............. *H01L 33/12* (2013.01); *H01L 33/0025* (2013.01); *H01L 33/06* (2013.01); *H01L 33/32* (2013.01)

(58) Field of Classification Search
None
See application file for complete search history.

(56) References Cited

U.S. PATENT DOCUMENTS

| | | | |
|---|---|---|---|
| 2003/0209705 A1* | 11/2003 | Emerson et al. ................. 257/14 |
| 2004/0079955 A1* | 4/2004 | Furukawa ............. H01L 33/007 257/98 |
| 2005/0056824 A1* | 3/2005 | Bergmann et al. ............... 257/14 |
| 2009/0127583 A1* | 5/2009 | Ohachi .................. B82Y 20/00 257/190 |
| 2011/0212559 A1* | 9/2011 | Ohmae ................... C30B 23/04 438/46 |

FOREIGN PATENT DOCUMENTS

GB   2485418 A  *  5/2012

* cited by examiner

*Primary Examiner* — Khaja Ahmad
(74) *Attorney, Agent, or Firm* — Bacon & Thomas, PLLC

(57) ABSTRACT

A light emitting diode device is provided, which comprises a silicon-based substrate, a buffer layer, a super lattice structure layer, a nano-structure layer, a first semiconductor layer, a light emitting layer, and a second semiconductor layer. The buffer layer is formed on the silicon-based substrate, the super lattice structure layer is formed on the buffer layer, the nano-structure layer is formed on the super lattice structure layer, a first semiconductor layer is formed on the nano-structure layer, and the light emitting layer is formed between the first semiconductor layer and the second semiconductor layer. The super lattice layer and the nano-structure can release the stress within the light emitting diode device, and reduce the epitaxy defect, so that the internal quantum effect and the external quantum effect can be increased.

3 Claims, 1 Drawing Sheet

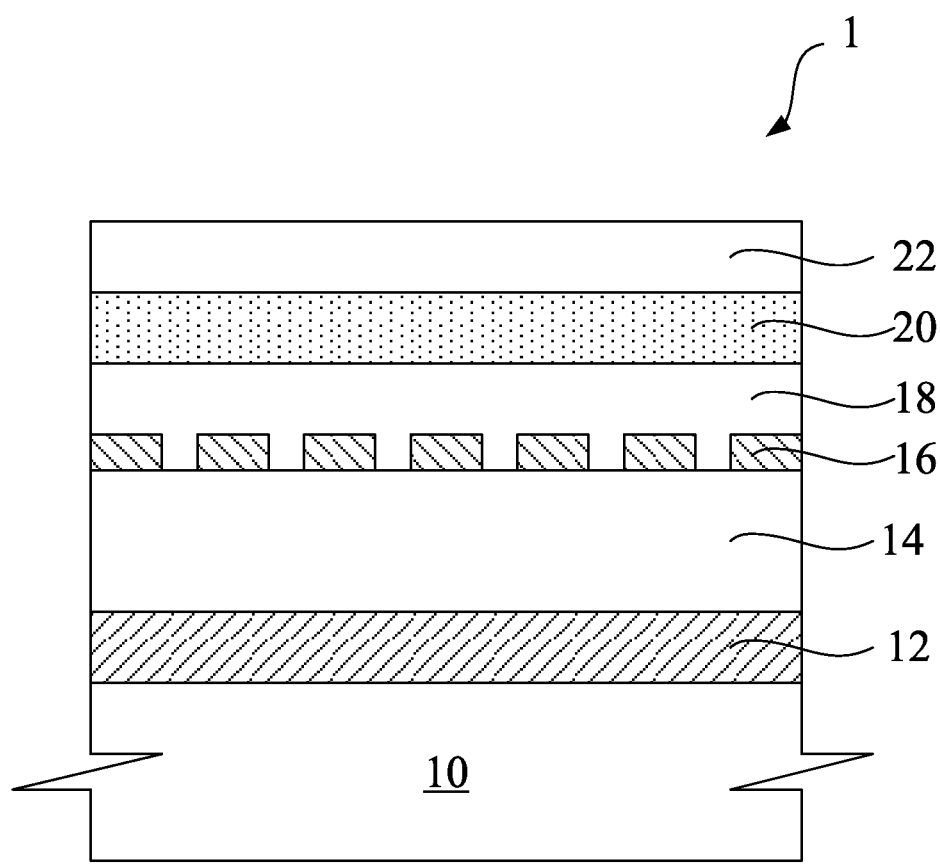

LIGHT EMITTING DIODE DEVICE HAVING SUPER LATTICE STRUCTURE AND A NANO-STRUCTURE LAYER

BACKGROUND OF THE INVENTION

1. Field of the Invention

The present invention relates to a light emitting diode device, particularly to a light emitting diode device having a nano-structure layer and a super lattice structure layer formed on a silicon-based substrate.

2. Description of the Prior Art

The application of light emitting diode (LED) is much more popularized in various electronic products and industry day by day. Due to the required energy cost of the light emitting diode is far below the conventional incandescent lamp or fluorescent lamp, and the size of single light emitting diode is much compact than the conventional illuminator, so that the demand of the light emitting diode is also increased day by day under the trend of light, thin, short and small electronic product.

The light emitting diode is the light emitting device which is able to convert the electric energy into the light energy directly. Because it is not necessary to convert the electric energy by using the mechanism of the hot carrier-induced emission, the light emitting diode is also called the cold light emitting device. Except there is high light emitting efficiency, the light emitting diode is also a small solid state illuminator, which can be used to make the semiconductor chip with p-n junction structure. After the voltage is applied to both ends of this p-n junction, the electrons and holes will flow towards this p-n junction immediately, and bond together to release the photons.

As for the luminance of the light emitting diode, it is generally acknowledged that the efficiency of current light emitting diode is about a half of that of cold cathode fluorescent lamp, even its light emitting effect is about the same as that of cold cathode fluorescent lamp. The light emitting efficiency of the light emitting diode mainly relates to two factors: the first one is the light emitting efficiency of the semiconductor, and the second one is the light release rate of encapsulated semiconductor chip. The main development direction for the light emitting efficiency of the semiconductor chip comprises: the research and development of the electroluminescence material, and the research on enhancing the crystallinity of the semiconductor chip, in order to increase the quantum effect inside the semiconductor chip.

SUMMARY OF THE INVENTION

According to the shortcoming of the prior art, the main purpose of the present invention is to disclose a light emitting diode device having a silicon-based substrate. A super lattice structure layer is formed inside the light emitting diode device. Because the thickness of the super lattice structure layer is extremely thin, and the stress can be lowered effectively according to the material characteristics, the quantum dropping effect of the light emitting diode can be reduced and the epitaxy quality can be increased.

The main purpose of the present invention is to disclose a light emitting diode device having a silicon-based substrate. The super lattice structure in the light emitting diode is mainly used to buffer the stress between the substrate and the first semiconductor GaN layer. Through adjusting the thickness of two different materials, such as aluminum gallium nitride/gallium nitride (AlGaN/GaN), it is able to reduce the stress of the corresponding thickness.

Another purpose of the present invention is to disclose a light emitting diode device having a silicon-based substrate. A super lattice structure layer is formed inside the light emitting diode device. It can reduce the epitaxy defect, increase the epitaxy quality, increase the internal quantum effect (IQE), and increase the backlight scattering effect. The light scattering effect of the light emitting layer towards the silicon-based substrate is increased, so that the light emitting effect of the light emitting diode and the external quantum effect (EQE) can be increased.

According to the abovementioned purposes, the present invention discloses a light emitting diode device, which comprises a silicon-based substrate, a buffer layer, a super lattice structure layer, a nano-structure layer, a first semiconductor layer, a light emitting layer, and a second semiconductor layer. The buffer layer is formed on the silicon-based substrate, the super lattice structure layer is formed on the buffer layer, the nano-structure layer is formed on the super lattice structure layer, a first semiconductor layer is formed on the nano-structure layer, and the light emitting layer is formed between the first semiconductor layer and the second semiconductor layer. The super lattice layer and the nano-structure can release the stress within the light emitting diode device, and reduce the epitaxy defect, so that the internal quantum effect and the external quantum effect can be increased.

Therefore, the advantage and spirit of the present invention can be understood further by the following detail description of invention and attached Figures.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 illustrates the cross-sectional view of the light emitting diode device according to the art disclosed by the present invention.

DESCRIPTION OF THE PREFERRED EMBODIMENT

Please refer to FIG. 1. FIG. 1 illustrates the cross-sectional view of the light emitting diode device according to the technology disclosed by the present invention. As shown in FIG. 1, the light emitting diode device 1 comprises a substrate 10, a buffer layer 12, a super lattice structure layer 14, a nano-structure layer 16, a first semiconductor layer 18, a light emitting layer 20 and a second semiconductor layer 22 from bottom to top.

In an embodiment of the present invention, the substrate 10 is the silicon-based substrate, which is used to substitute the conventional sapphire substrate. In this embodiment, the reason for using the silicon-based substrate is cheaper, larger wafer, such as 12" wafer, can be made, and the heat dissipation is better. Thus, the light emitting diode device provided by the present invention can be integrated with other large silicon-based semiconductor process equipment.

The buffer layer 12 is formed on the silicon-based substrate 10. The epitaxy growing method is used to form the buffer layer 12 on the silicon-based substrate 10. The material of the buffer layer 12 may be the aluminum gallium nitride (AlGaN). Then, the super lattice structure layer 14 is formed on the buffer layer 12. The super lattice structure layer 14 may be composed of multi-layer of aluminum gallium nitride/gallium nitride (AlGaN/GaN) pairs. In an embodiment, the super lattice structure layer 14 may be a single-layer structure formed on the buffer layer 12; while in another embodiment, the super lattice structure layer 14 may be a multi-layer structure formed on the buffer layer 12. No matter single-layer or multi-layer super lattice structure layer 14 is formed on the buffer layer 12, the thickness is very thin. The thickness of a layer (AlGaN or GaN) is about 1 nm to 10 nm, and total thickness is about 100 nm to 1000 nm. The thickness of the super lattice structure layer 14 depends on the number of pairs. For example, the super lattice structure is often piled up by 2 nm scale dielectric materials, such as 1 nm/1 nm, 2 nm/2 nm or 2 nm/6 m of aluminum gallium nitride/gallium nitride (AlGaN/GaN). There is no fixed form, which normally depends on the growth environment, such as the growth temperature, the growth machine and the stress control requirement etc. Through forming the super lattice structure layer 14 on the light emitting diode device 1, the stress can be reduced effectively, the quantum dropping effect of the light emitting diode can be reduced and the epitaxy quality can be increased. Thus, through the super lattice structure layer 14 of the light emitting diode device 1 disclosed by the present invention, the light emitting efficiency of the light emitting diode device 1 can be increased.

Then, please refer to FIG. 1 again. The nano-structure layer 16 is formed on the super lattice structure layer 14. The material of the nano-structure layer 16 may be the silicon dioxide ($SiO_2$), silicon nitride ($SiN_x$), air voids or composite single-layer dielectric material. The thickness on the super lattice structure layer 14 is about 10 nm to 2000 nm. In an embodiment of the present invention, the nano-structure layer 16 may be a continuous structure or discontinuous structure formed on the super lattice structure layer 14. The advantage of the present invention is able to reduce the epitaxy defect, increase the internal quantum effect (IQE), increase the scattering effect and increase the external quantum effect (EQE). Thus, through the nano-structure layer 16 of the light emitting diode device 1 disclosed by the present invention, the light emitting efficiency of the light emitting diode device 1 can be increased.

Then, please refer to FIG. 1 again. In the light emitting diode device 1 disclosed by the present invention, the first semiconductor layer 18 is formed on the nano-structure layer 16 and the light emitting layer 20 is formed between the first semiconductor layer 18 and the second semiconductor layer 22. The first semiconductor layer 18 is the n-type GaN, and the second semiconductor layer 22 is the p-type GaN. The light emitting layer 20 may be single quantum well or multi-quantum well. In an embodiment of the present invention, the first semiconductor layer 18, the light emitting layer 20 and the second semiconductor layer 22 are formed on the light emitting diode device 1 by the epitaxy growing method.

According to the light emitting diode device 1 disclosed by the present invention, the advantage for using the silicon-based substrate is cheaper, larger wafer, such as 12" wafer, can be made, which can be integrated with other large silicon-based semiconductor process equipment. The heat dissipation is better, so that the heat generated by the operating light emitting diode device 1 can be released to the ambient environment easily. In addition, the super lattice structure layer 14 can be used to buffer the stress between the silicon-based substrate and the GaN grown on the silicon-based substrate. Through adjusting the thickness of two different materials, such as aluminum gallium nitride/gallium nitride (AlGaN/GaN), it is able to reduce the stress of the corresponding thickness, so the quantum dropping effect of the light emitting diode can be reduced. As for another advantage, the super lattice structure layer 16 can reduce the epitaxy defect, increase the epitaxy quality, and increase the backlight scattering effect towards the substrate, so as to increase the light emitting effect of the light emitting diode device 1. The internal quantum effect and the external quantum effect can also be increased to increase the scattering effect of the light emitting diode device 1, in order to increase the light emitting efficiency of the light emitting diode device 1.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A light emitting diode device having a super lattice structure layer, comprising:
    a silicon-based substrate;
    a buffer layer formed on the silicon-based substrate, wherein the buffer layer comprises aluminum gallium nitride (AlGaN);
    a super lattice structure layer formed on the buffer layer such that the buffer layer is between the silicon-based substrate and the super lattice structure layer, wherein the super lattice structure layer is composed of multi-layer of aluminum gallium nitride/gallium nitride (AlGaN/GaN) pairs and piled up by 2 nm scale dielectric materials such as 1 nm/1 nm, 2 nm/2 nm or 2 nm/6 nm of aluminum gallium nitride/gallium nitride (AlGaN/GaN);
    a nano-structure layer formed in contact with the super lattice structure layer, wherein the nano-structure layer is selected from the group consisting of silicon dioxide ($SiO_2$), silicon nitride ($SiN_x$), air voids and composite single-layer dielectric material;
    a first semiconductor layer formed on the nano-structure layer and portions of the first semiconductor layer are in contact with the super lattice structure layer, wherein the first semiconductor layer is n-type GaN;
    a light emitting layer formed on the first semiconductor layer, wherein the light emitting layer is selected from the group consisting of single Quantum well and multi-Quantum well; and
    a second semiconductor layer formed on the light emitting layer, and the second semiconductor layer is p-type GaN.

2. The device according to claim 1, wherein the nano-structure layer is selected from the group consisting of a continuous structure and discontinuous structure formed on the super lattice structure layer.

3. The device according to claim 1, wherein the thickness of the super lattice structure layer is about 1 nm to 10 nm, and total thickness is about 100 nm to 1000 nm.

* * * * *